US 6,429,096 B1

(12) United States Patent
Yanagida

(10) Patent No.: US 6,429,096 B1
(45) Date of Patent: Aug. 6, 2002

(54) METHOD OF MAKING THINNED, STACKABLE SEMICONDUCTOR DEVICE

(75) Inventor: Toshiharu Yanagida, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/532,792

(22) Filed: Mar. 22, 2000

(30) Foreign Application Priority Data

Mar. 29, 1999 (JP) .......................................... 11-086152

(51) Int. Cl.[7] .......................... H01L 21/46; H01L 21/76; H01L 21/301; H01L 21/44
(52) U.S. Cl. ........................ 438/459; 438/406; 438/455; 438/460; 438/465; 438/612
(58) Field of Search ................................. 438/406, 455, 438/458, 459, 460, 462–465, 612, 613

(56) References Cited

U.S. PATENT DOCUMENTS 5,646,067 A * 7/1997 Gaul ........................... 438/458

* cited by examiner

*Primary Examiner*—Ha Tran Nguyen
(74) *Attorney, Agent, or Firm*—Sonnenschein, Nath & Rosenthal

(57) ABSTRACT

A method of manufacturing a semiconductor device, comprising preparing a semiconductor device wafer which is formed with an LSI; working the semiconductor device wafer from the back surface thereof, thereby to diminish the thickness of the semiconductor device wafer to at most 200 [μm]; forming penetrant apertures in the resulting semiconductor device wafer; forming wiring plugs (23 in FIG. 7) in the respective penetrant apertures; dicing the semiconductor device wafer, thereby to be divided into semiconductor chips (7) each of which includes the wiring plugs (23); and mounting at least two of the semiconductor chips (7) over a printed-wiring circuit board (25) through bumps (10) connected with the wiring plugs (23). Thus, the ultrathin stacked multilevel mounting of semiconductor device components can be realized at a high reliability and with a high functionality.

16 Claims, 7 Drawing Sheets

FIG. 2
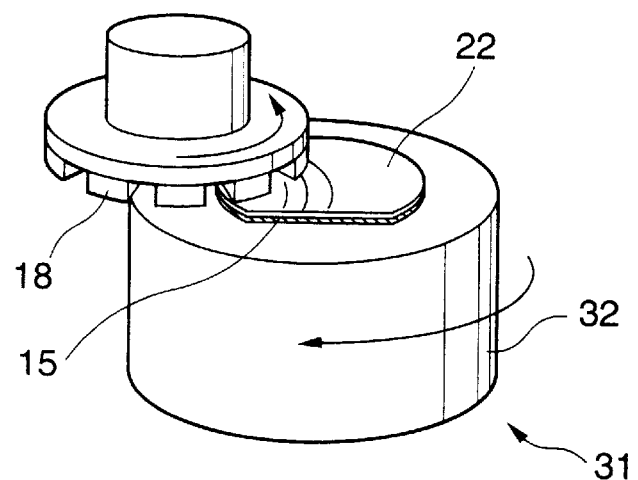
FIG. 3A
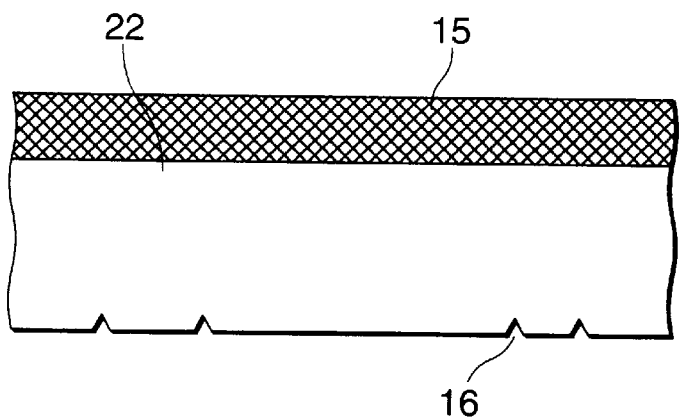
FIG. 3B

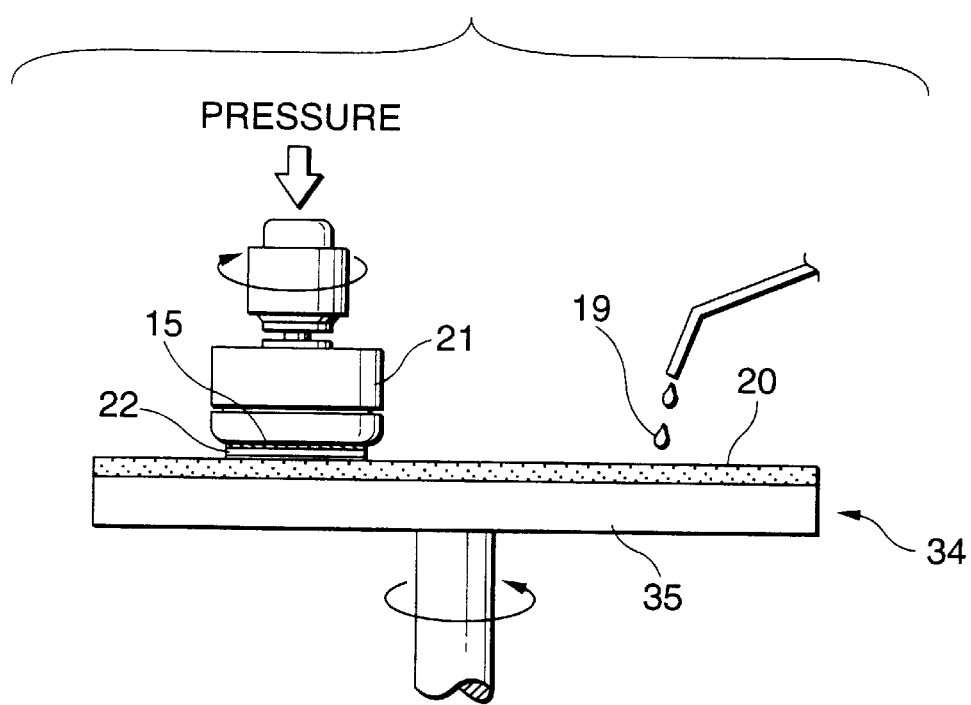

METHOD OF MAKING THINNED, STACKABLE SEMICONDUCTOR DEVICE

BACKGROUND OF THE INVENTION

1. Field of the Invention

The present invention relates to a semiconductor device and a manufacturing method therefor which are applied to the fabrication of electronic equipment. More particularly, it relates to a semiconductor device wafer for incarnating the ultrathin and light construction of electronic equipment, as well as a semiconductor device having a structure in which such wafers are mounted in three dimensions (namely, in multilevel fashion), and a method of manufacturing the semiconductor device wafer as well as the semiconductor device.

2. Description of the Related Art

In order to promote reduction in the size of electronic equipment still further, it becomes an important point how the mounting density of semiconductor device components is heightened. Regarding also semiconductor ICs (integrated circuits), high-density mounting techniques, such as flip-chip mounting, in which an LSI (large-scale integrated circuit) chip is directly mounted on a printed-wiring circuit board alternatively to conventional package mounting, have been vigorously developed in the business world.

One of connecting methods based on a flip chip is a method wherein solder ball bumps are formed and mounted on the Al (aluminum) electrode pads of a semiconductor IC. A method of forming the solder ball bumps on the predetermined electrodes, employs electroplating. This method has the problem of being basically difficult to form the solder ball bumps of uniform heights within an IC chip because the thickness of a solder film to be formed is affected by slight dispersions in the surface state and electric resistance of a subbing material layer.

Dispersion in the heights of such solder ball bumps can be suppressed by a pattern forming method which employs the formation of the solder film by vacuum evaporation and the lift-off of a photoresist film. An example of a process for forming the solder ball bumps in accordance with this method, is illustrated in FIGS. 1A–1E of the accompanying drawings.

FIGS. 1A–1E are sectional views showing a method of forming solder ball bumps on Al electrode pads.

First, as shown in FIG. 1A, a film of Al—Cu (copper) alloy or the like is deposited on a semiconductor substrate 1 of silicon or the like by sputtering, and it is etched, whereby each Al electrode pad 2 is formed on the semiconductor substrate 1. Subsequently, the whole surface of the semiconductor substrate 1 including the Al electrode pads 2 is covered with a surface protective film 3 which is made of silicon nitride, polyimide or the like, whereupon the surface protective film 3 is formed by etching with each opening 3a which overlies the electrode pad 2. Subsequently, each BLM (Ball Limiting Metal) film 4 is formed in the opening 3a and on the surface protective film 3 by sputtering. Thus, each joint portion of a flip-chip IC is formed. Incidentally, the BLM film 4 is a multilayer metal film which is made of at least two of Cr (chromium), Cu, Au (gold), etc.

Thereafter, as shown in FIG. 1B, a resist pattern 6 which has each opening 5 overlying the BLM film 4 is provided on the surface protective film 3. Subsequently, as shown in FIG. 1C, an evaporated solder film 13 is formed on the whole surface of the resulting structure including the interior of each opening 5.

Thereafter, as shown in FIG. 1D, the unnecessary part of the evaporated solder film 13 is removed together with the resist pattern 6 by lifting off this resist pattern 6, whereby the desired pattern of the evaporated solder film is formed on the BLM films 4. Subsequently, as shown in FIG. 1E, the solder of the evaporated solder film is molten by a heat treatment, whereby each refractory solder ball bump 14 is finally formed on the corresponding BLM film 4.

The device chip formed with the bumps by employing the process proposed by the inventors as explained above is mounted on a printed-wiring circuit board by flip-chip mounting. Then, a mother board can be made smaller than in case of mounting a conventional device packaged with a molding resin. Therefore, the inventors have contributed to the incarnation of the smaller and lighter constructions of various electronic equipment.

Nevertheless, the mounting space of a semiconductor device should be reduced to the utmost for each of portable electronic equipment including an IC card, a portable telephone, a PDA (Personal Digital Assistant), etc. Accordingly, it is earnestly desired to establish a stacked (or multilayer) three-dimensional (or multilevel) high-density mounting technique which can make the semiconductor device still thinner in the height direction thereof, in addition to two-dimensional (or areal) space saving which has heretofore been mainly aimed at.

SUMMARY OF THE INVENTION

The present invention has been made in consideration of the circumstances as stated above, and has for its object to provide a semiconductor device and a manufacturing method therefor according to which the stacked ultrathin three-dimensional (or multilevel) mounting of semiconductor device components can be realized at a high reliability and with a high functionality.

In order to accomplish the object, a method of manufacturing a semiconductor device according to the first aspect of performance of the present invention is characterized by comprising the step of preparing a semiconductor device wafer which is formed with an LSI; the step of working the semiconductor device wafer from a back surface thereof, thereby to diminish a thickness of said semiconductor device wafer to at most 200 [μm]; the step of forming a penetrant hole in the resulting semiconductor device wafer; and the step of forming a wiring plug in the penetrant hole.

A semiconductor device according to the second aspect of performance of the present invention is characterized by comprising a semiconductor device wafer which is formed with an LSI in its front surface, and which has been worked from its back surface, thereby to diminish its thickness to at most 200 [μm]; a penetrant hole which is formed in the semiconductor device wafer; and a wiring plug which is formed in the penetrant hole.

A method of manufacturing a semiconductor device according to the third aspect of performance of the present invention is characterized by comprising the step of preparing a semiconductor device wafer which is formed with an LSI, and an electrode pad lying at a peripheral edge of the LSI; the step of working the semiconductor device wafer from a back surface thereof, thereby to diminish a thickness of said semiconductor device wafer to at most 200 [μm]; the step of coating both a front surface and the back surface of the resulting semiconductor device wafer with an insulating material; the step of forming a hole which penetrates through coatings of the insulating material, the electrode pad and said semiconductor device wafer, by laser processing;

and the step of forming a wiring plug for joining the front and back surfaces of said semiconductor device wafer, in the hole. Besides, as a working method in the case of working the semiconductor device wafer from the back surface, any can be employed as long as it is a working method adapted to thin the wafer. It is favorable, however, to employ grinding, chemical mechanical polishing, or etching by way of example.

With the method of manufacturing a semiconductor device in the third aspect, each of the surfaces of the wafer before the laser processing is coated with the insulating material in advance, whereby at the step of forming the microscopic penetrant hole in the thin wafer by the laser processing, the tapering angle of the penetrant hole can be restrained from widening at that opening end of the surface to-be-processed which a laser beam enters. As a result, the penetrant hole having a more perpendicular (or less tapering) sectional shape can be stably formed, and the penetrant hole joining the front surface and back surface of the wafer can be formed at a high precision. It is accordingly possible to form the wiring plug for directly stacking and mounting the semiconductor device. It is therefore possible to mount semiconductor device components by thin high-density mounting which serves to incarnate the ultra-small and ultrathin implementation of an electronic equipment.

The method of manufacturing a semiconductor device in the third aspect of performance should preferably further comprise after said step of forming said hole, the step of coating both the surfaces of the resulting semiconductor device wafer with an insulating material again, thereby to fill up said hole with the insulating material, and then forming a penetrant aperture having a diameter smaller than that of said hole, in said insulating material contained in said hole.

With the preceding method of manufacturing a semiconductor device, after the formation of the hole which penetrates through the semiconductor device wafer, both the wafer surfaces are coated with the insulating material again, thereby to fill up the hole with the insulating material, so that the penetrant aperture being smaller in diameter than the hole can be subsequently formed in the insulating material contained in the hole. Thus, the insulating material can be left on the inside wall of the hole so as to have a uniform thickness. Incidentally, after both the wafer surfaces have been coated with the insulating material again, the thickness of the insulating material on each of both the wafer surfaces is adjusted by polishing or the like as may be needed, whereby the work of the penetrant aperture at a higher precision can be stably carried out.

In addition, the reasons why the insulating material is left on the inside wall of the hole at the uniform thickness are to reliably insulate the wiring plug and the semiconductor device wafer, when the wiring plug which joins the front surface and back surface of the semiconductor device wafer is formed at the later step, and to reliably prevent electric current from leaking from the wiring plugs for connecting stacked semiconductor device chips, when the device chips have been stacked and mounted later.

A method of manufacturing a semiconductor device according to the fourth aspect of performance of the present invention is characterized by comprising the step of preparing a semiconductor device wafer which is formed with an LSI, and an electrode pad lying at a peripheral edge of the LSI; the step of working the semiconductor device wafer from a back surface thereof, thereby to diminish a thickness of said semiconductor device wafer to at most 200 [$\mu$m]; the step of coating both a front surface and the back surface of the resulting semiconductor device wafer with an insulating material; the step of forming a hole which penetrates through coatings of the insulating material, the electrode pad and said semiconductor device wafer; the step of coating both the surfaces of the resulting semiconductor device wafer with an insulating material again, thereby to fill up said hole with the insulating material; the step of forming a penetrant aperture having a diameter smaller than that of said hole, in said insulating material contained in said hole, and simultaneously leaving said insulating material on an inwall of said hole; the step of forming wiring layers which join the interior of said penetrant aperture and the front and back surfaces of said semiconductor device wafer; and the step of patterning the wiring layers, thereby to form a wiring plug which includes respective electrode pads on said front and back surfaces of said semiconductor device wafer, and which joins said front and back surfaces of said semiconductor device wafer.

In the method of manufacturing a semiconductor device in the fourth aspect of performance, the wiring plug should preferably be formed by subjecting the semiconductor device wafer to electroless plating and electroplating in succession.

With the preceding method of manufacturing a semiconductor device, the thinned semiconductor device wafer is first subjected to the electroless plating, thereby to form thin seed layers of metal (for example, Cu) on the wafer surfaces including the inwall of the penetrant aperture. Thereafter, the resulting semiconductor device wafer is subjected to the electroplating by employing the seed layers as electrodes, whereby the metal wiring layers are formed on the whole wafer surfaces while filling up the penetrant aperture. Besides, resist patterns are respectively formed on the metal wiring layers by lithography, and both the wafer surfaces are subjected to etching with an etchant, whereby the wiring plug which joins both the surfaces of the semiconductor device wafer is formed, and the electrode pads for stacked (or multilayer) mounting are formed at both the ends of the wiring plug.

In the method of manufacturing a semiconductor device according to the third or fourth aspect of performance of the present invention, the insulating materials should preferably be made of a liquefied resin or an organic resist material. Favorable as the liquefied resin is an epoxy type resin, a silicone type resin, a phenol type resin, or the like.

A method of manufacturing a semiconductor device according to the fifth aspect of performance of the present invention is characterized by comprising the step of preparing a semiconductor device wafer which is formed with an LSI; the step of working the semiconductor device wafer from a back surface thereof, thereby to diminish a thickness of said semiconductor device wafer to at most 200 [$\mu$m]; the step of forming penetrant apertures in the resulting semiconductor device wafer; the step of forming wiring plugs in the respective penetrant apertures; the step of dicing said semiconductor device wafer, thereby to be divided into semiconductor chips each of which includes the wiring plugs; and the step of stacking and mounting at least two of the semiconductor chips over a printed-wiring circuit board through connection means connected with said wiring plugs.

With the method of manufacturing a semiconductor device in the fifth aspect of performance, the thinned semiconductor device wafer is split into the semiconductor chips, and at least two of the semiconductor chips can be stacked and mounted over the printed-wiring circuit board. Here, it is possible in principle to stack and mount any number of semiconductor chips in multistage fashion. Moreover, since the chips have been subjected to the thinning work beforehand, the mounting height of the semiconductor device can be suppressed low even when the chips are stacked in the multistage fashion. It is accordingly possible to provide a semiconductor device module having a high functionality.

In the method of manufacturing a semiconductor device in the fifth aspect of performance, the connection means should preferably be at least one of a solder ball bump, a wire bump, an anisotropic conductive film and a conductive paste.

A semiconductor device according to the sixth aspect of performance of the present invention is characterized by comprising a printed-wiring circuit board which is furnished with lands on its front surface; and a plurality of semiconductor chips each of which has a thickness of at most 200 [$\mu$m], and which are stacked and mounted over the printed-wiring circuit board through connection means; each of the semiconductor chips including penetrant apertures which penetrate through said each semiconductor chip, and wiring plugs which are respectively formed in the penetrant apertures; the lands and the wiring plugs being electrically connected by the connection means, respectively.

By the way, the present invention is very effective for manufacturing a future semiconductor device of which a high functionality, a high reliability, a small size and a light weight are required.

BRIEF DESCRIPTION OF THE DRAWINGS

FIG. 2 is a perspective view schematically showing a back grinder which is employed for the thinning grinding work of the back surface of a silicon wafer in a method of manufacturing a semiconductor device according to the first or second embodiment of the present invention;

FIGS. 3A and 3B illustrate the situations of the grinding work of the back surface of the wafer by the back grinder shown in FIG. 2, wherein FIG. 3A is a sectional view showing the state in which a protective tape is stuck on the front surface of the wafer before being worked by the back grinder, while FIG. 3B is a sectional view showing the state in which the flaws of the back surface of the wafer have been removed by the grinding with the back grinder;

FIG. 4 is a sectional view schematically showing a chemical mechanical polisher which is employed for the finishing work of the ground and thinned wafer in the method of manufacturing the semiconductor device according to the first embodiment of the present invention;

PREFERRED EMBODIMENTS OF THE INVENTION

Figure 1A:
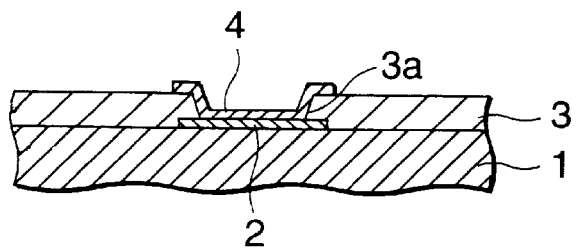
FIGS. 1A–1E are sectional views showing a method of forming solder ball bumps on Al electrode pads.
Figure 1B:
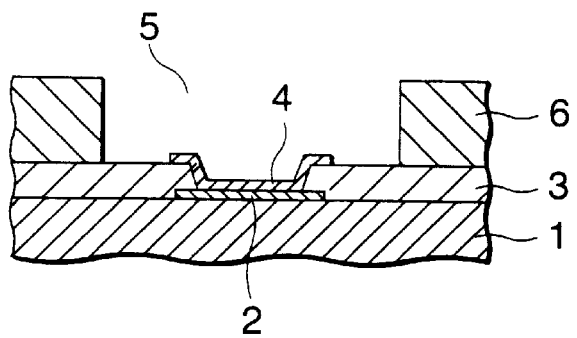
Figure 1C:
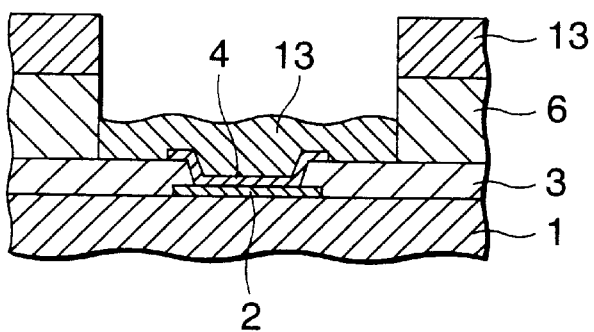
Figure 1D:
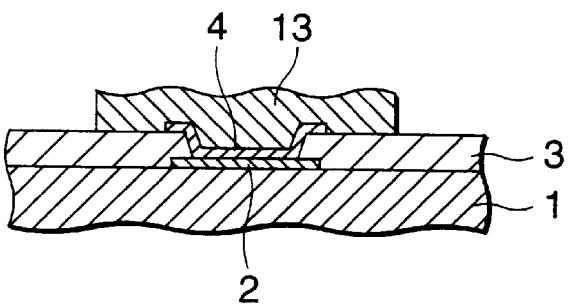
Figure 1E:
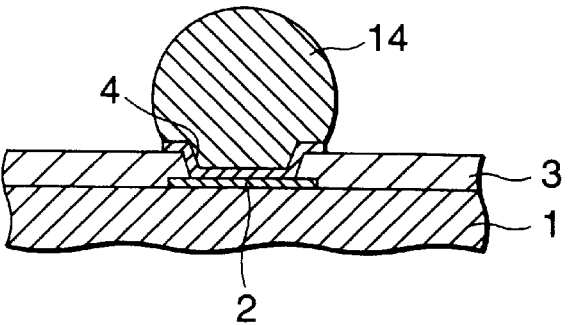

Now, the embodiments of the present invention will be described with reference to the drawings.

FIG. 2–FIG. 7 are views showing a method of manufacturing a semiconductor device according to the first embodiment of the present invention.

The first embodiment is such that the present invention is applied to a process for mounting semiconductor device components. Concretely, it is an example in which the back surface of each silicon wafer is subjected to a thinning work by the use of grinding and chemical mechanical polishing, metal VIA wiring lines penetrating through the silicon wafer are thereafter laid for electrode pads arranged at the peripheral edge of an LSI, a plurality of thin semiconductor chips are joined to each other or one another by employing solder balls as joint means, and the joined thin semiconductor chips are mounted on a mother board by stacked (or multilayer) three-dimensional (or multilevel) mounting.

As shown in FIG. 2, first of all, a silicon device wafer 22 in which an LSI has been made up beforehand is prepared, and a surface protective tape 15 is stuck onto that surface (front surface) of the wafer 22 over which the LSI has been made up. Thereafter, the wafer 22 is set on the surface table 32 of a grinder 31. On this occasion, the wafer 22 is so set that the surface protective tape 15 comes into touch with the surface table 32. Besides, the back surface of the silicon wafer 22 at this time (before a back-grinding work) lies in a state where a large number of flaws 16 are involved as shown in FIG. 3A. The flaws 16 of the back surface are inevitably formed for the reason that the wafer undergoes numerous processes at its preprocessing stages for making up the LSI.

Subsequently, while the wafer 22 is being rotated, the back surface thereof is subjected to the back-grinding work under conditions stated below, by a grinding wheel 18 kept rotating. Thus, as shown in FIG. 3B, the wafer 22 is ground and thinned down to a thickness of 110 [$\mu$m], and the back surface flaws 16 thereof are removed by the grinding.

Feed speed of Grinding wheel: 150 [$\mu$m/min]

Rotational frequency of Grinding wheel: 2500 [r.p.m.]

Thickness of Ground wafer: 110 [$\mu$m] (Thickness diminished by Grinding: About 510 [$\mu$m])

Thereafter, as shown in FIG. 4, the wafer 22 subjected to the thinning work is set on the wafer carrier 21 of a chemical mechanical polisher 34. On this occasion, the wafer 22 is so set that the surface protective tape 15 comes into touch with the wafer carrier 21.

Subsequently, while the wafer 22 is being rotated, the back surface thereof is polished as a finishing treatment under conditions stated below, by a surface table 35 kept rotating. On this occasion, a polishing cloth 20 is stuck on the surface table 35, a polishing solvent or slurry 19 is discharged onto the polishing cloth 20, and a pressure is exerted on the wafer 22 toward the surface table 35. Thus, damages having been formed anew on the back surface of the wafer 22 due to the grinding are removed, and the mechanical strength of the wafer 22 polished and thinned down to a thickness of 100 [μm] can be enhanced.

Rotational frequency of Wafer: 80 [r.p.m.]
Rotational frequency of Surface table: 80 [r.p.m.]
Polishing pressure: 400 [gr./cm$^2$]
Rocking speed: 2 [mm/sec]
Supply rate of Slurry: 40 [ml./min]
Thickness diminished by Polishing: 10 [μm]

Figure 5A:
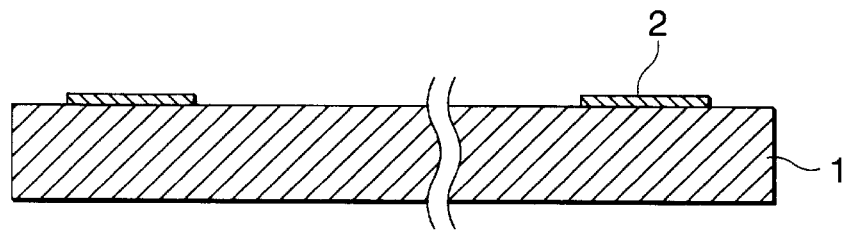
FIGS. 5A thru 5D are sectional views showing the processing steps of forming penetrant VIA wiring lines in the polished and thinned semiconductor device chip in the method of manufacturing the semiconductor device according to the first or second embodiment of the present invention.

Thereafter, as shown in FIG. 5A, the surface protective tape 15 is stripped from the silicon device wafer 22 having ended the thinning work. The wafer 22 at this time lies in a state where it has been formed with the LSI and has been polished and thinned. Next, the manufacturing method advances to a process for forming penetrant VIA wiring lines as illustrated in FIGS. 5A–5D and FIGS. 6E–6G. In these figures, however, the LSI made up in a silicon substrate 1 is omitted from illustration, and only the device wafer (to be divided into chips) being one unit and Al electrode pads 2 arranged at the peripheral edge of the wafer (each chip) are depicted. Incidentally, these figures are sectional views in which the process for forming the penetrant VIA wiring lines in the polished and thinned semiconductor device wafer (chips) is schematically shown in the sequence of the steps thereof.

Figure 5B:
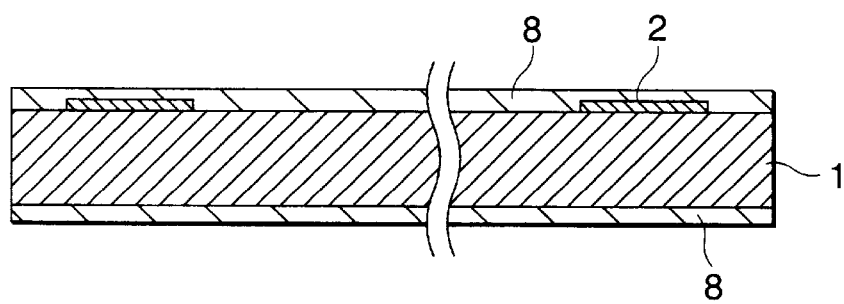

Subsequently, as shown in FIG. 5B, a liquefied resin of epoxy type 8 is applied onto each of the surfaces of the silicon substrate 1 to a thickness of about 20 [μm], and it is thermally cured. Thus, the wafer falls into a state where the whole surfaces thereof are coated with the epoxy type resin 8, which is cured.

Figure 5C:
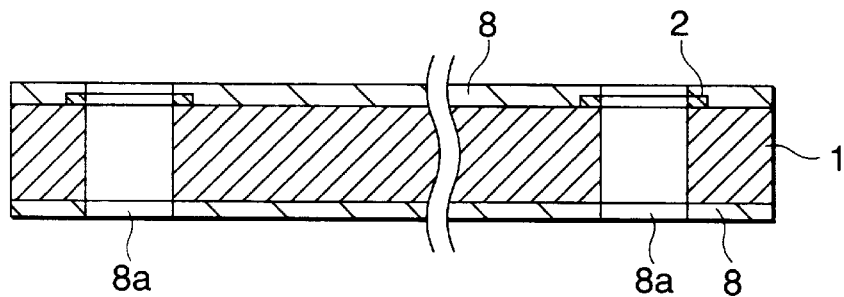

Thereafter, as shown in FIG. 5C, each of VIA holes (penetrant holes) 8a being about 90 [μm] in diameter, which penetrates through the coatings of the epoxy type resin 8, the corresponding Al electrode pad 2 and the thinned silicon substrate 1, is formed by laser processing with aim taken at the center of the Al electrode pad 2 arranged at the peripheral edge of the wafer (chips). A laser processing apparatus (not shown) which includes a UV-YAG (ultraviolet-yttrium aluminum garnet) laser subjected to harmonic modulation is used on this occasion. The wavelength of the UV-YAG laser is 0.355 [μm]. It is desirable to employ, for example, a laser drill system "Model 5100" (trademark of Engraving System Integrators, Inc.) as the UV-YAG laser processing apparatus.

The reason why each of the surfaces of the silicon substrate 1 is previously coated with the liquefied resin 8 before the laser processing, is to restrain the tapering angle of a hole from widening due to the inclination of a laser beam (relative to a perpendicular line to the surface to-be-processed) arising at that opening end of the surface which the laser beam enters, whereby the VIA hole 8a having a more perpendicular (or less tapering) sectional shape is formed at a high precision.

Figure 5D:
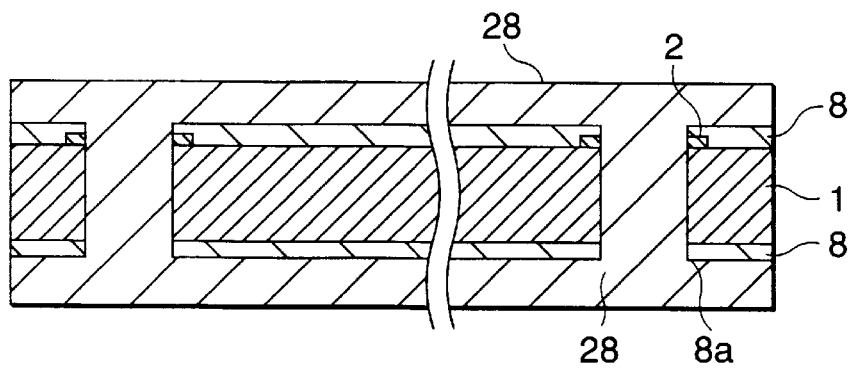

Subsequently, as shown in FIG. 5D, a liquefied resin of epoxy type 28 is applied onto each of the surfaces of the silicon substrate 1 again so as to be thicker than 20 [μm], and it is thermally cured, whereby the VIA holes 8a are filled up with the resin 28. That is, the wafer falls into a state where the penetrant holes 8a are packed with the resin 28.

Figure 6E:
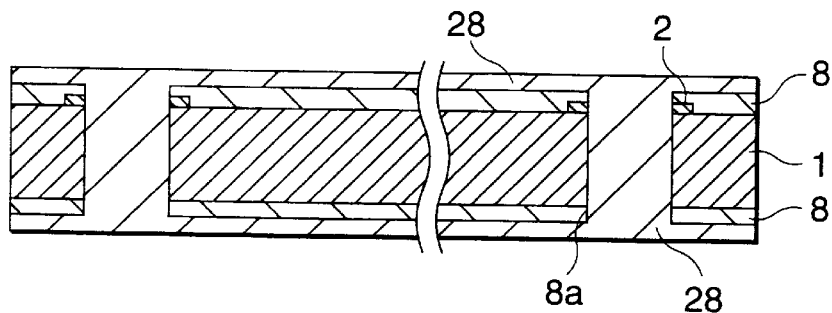
FIGS. 6E thru 6G illustrate the processing steps of forming the penetrant VIA wiring lines in the polished and thinned semiconductor device chip in the method of manufacturing the semiconductor device according to the first or second embodiment of the present invention, and they are sectional views showing the steps subsequent to the step shown in FIG. 5D.

Thereafter, the resulting silicon substrate 1 is set on, for example, the chemical mechanical polisher 34 shown in FIG. 4. Besides, as shown in FIG. 6E, the epoxy type resin 28 on each of the surfaces of the silicon substrate 1 is partially polished away so as to be thinned and flattened. On this occasion, the epoxy type resins 8 and 28 having a total thickness of about 40 [μm] are left on each of the surfaces of the silicon substrate 1.

Figure 6F:
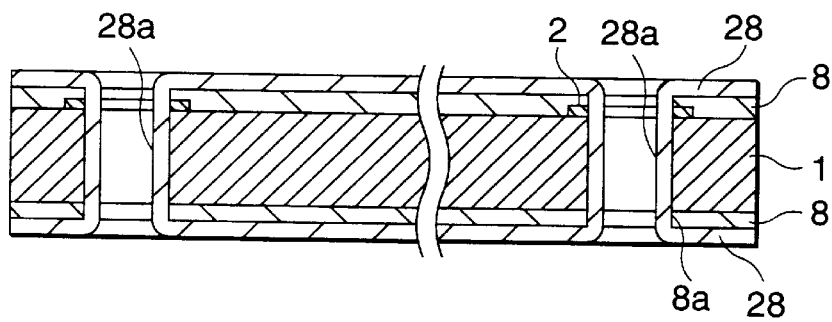

Subsequently, as shown in FIG. 6F, each of holes is provided by laser processing which employs the UV-YAG laser processing apparatus stated before and in which the diameter of the laser beam is reduced, with aim taken at the center of the VIA hole 8a in which the epoxy type resin 28 is buried. Thus, each of VIA holes 28a, which has a diameter of about 50 [μm] and which penetrates through the epoxy type resin 28 contained in the corresponding VIA hole 8a, is formed, while at the same time, an insulating layer, which has a thickness of about 20 [μm] and which is made of the epoxy type resin 28, is uniformly formed on the inwall of the VIA hole 8a.

Thereafter, the wafer is subjected to electroless plating with a metal, for example, Cu so as to form seed layers on its surfaces, and the resulting wafer is subjected to electroplating with the metal Cu by employing the seed layers as electrodes. Thus, Cu plugs are respectively formed in the penetrant VIA holes 28a. On this occasion, the Cu plugs can be respectively packed in the corresponding penetrant VIA holes 28a without developing voids, by optimizing the coating quantity and polishing quantity of the epoxy type resin 28 and the beam diameter in the laser processing beforehand.

Figure 6G:
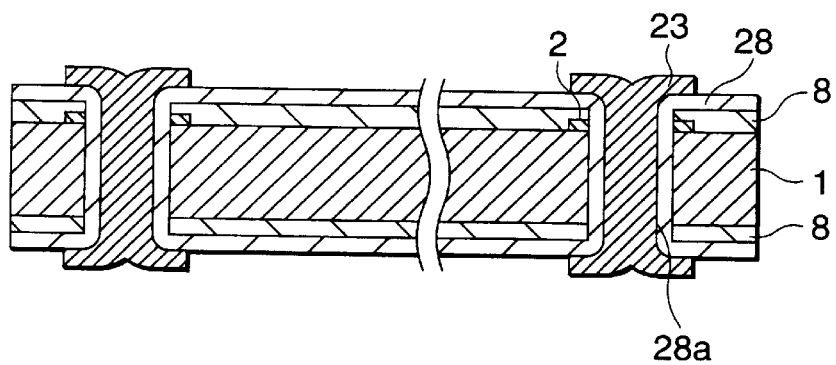

Lastly, masks are formed on both the surfaces of the wafer by lithography, and the wafer surfaces are subjected to etching. Then, as shown in FIG. 6G, VIA metal plugs 23 penetrating through the semiconductor device are formed in the VIA holes 28a, and electrode pads for external connections are formed at both the ends of each of the VIA metal plugs 23.

Figure 7:
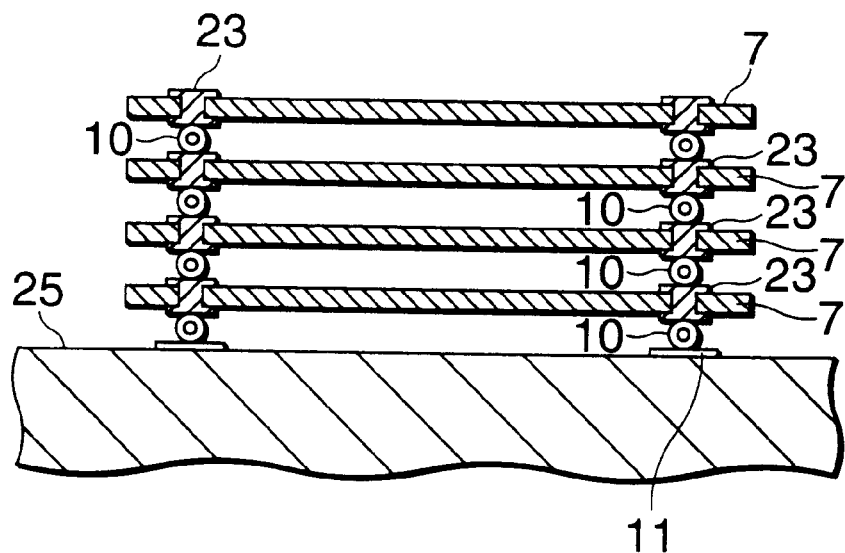
FIG. 7 illustrates the semiconductor device according to the first embodiment of the present invention, and it is a sectional view showing a state where the thinned semiconductor device chips are mounted on a mother board by stacked three-dimensional (or multilevel) mounting.

The thinned device wafer which has been formed with the penetrant VIA wiring plugs 23 in the above way, is divided into the individual chips by dicing, whereby the thinned semiconductor device chips 7 (four layers as one unit by way of example) for the stacked three-dimensional mounting are completed as seen from FIG. 7.

Thereafter, as shown in FIG. 7, solder ball bumps 10, for example, are formed as connection means on the electrode pads of the metal wiring plugs 23. Besides, a printed-wiring circuit board (mother board) 25 having Cu lands 11 is prepared, the semiconductor device chips 7 are registered over the mother board 25, and the chip 7 of the first layer is mounted on the mother board 25. Thus, the solder ball bumps 10 of the first-layer chip 7 are electrically connected to the respectively corresponding Cu lands 11 of the mother board 25.

Subsequently, the semiconductor device chip 7 of the second layer is mounted on the first-layer chip 7, the semiconductor device chip 7 of the third layer is mounted on the second-layer chip 7, and the semiconductor device chip 7 of the fourth layer is mounted on the third-layer chip 7. Thus, the metal wiring plugs 23 of the first-layer chip 7 thru the fourth-layer chip 7 are electrically connected to each other or one another by the electrode pads and the solder ball bumps 10. In this way, the semiconductor device of very low mounting height is mounted on the mother board 25 by the stacked three-dimensional mounting.

According to the first embodiment, it is permitted to realize the stacked ultrathin three-dimensional mounting of semiconductor device components at a high reliability and with a high functionality, and this can contribute to further reducing the size (or area), lightening the weight and diminishing the thickness of that product of an electronic equipment which includes the device components.

Besides, in this embodiment, the circumventive length of wiring between the device chips can be extraordinarily shortened as compared with that of wiring in the case of a conventional flat packaging circuit board, a multilayer mounting circuit board of wire connections, or the like. More specifically, in this embodiment, the mounting is possible without leading an Au wire piece about from the electrode pad of an LSI or without interposing the lead frame of a package, and hence, the inter-chip wiring length over the circuit board in the case where the device chips have been mounted on the circuit board can be sharply diminished. Therefore, this embodiment consists in the mounting technique which enables high-speed signal processing with a signal delay suppressed owing to the lowered inductance of each wiring portion, which is greatly effective to be applied to high-speed and high-frequency devices in the future, and which can manufacture semiconductor device components of high functionality. Accordingly, regarding also those final products of electronic equipment which are assembled by adopting devices based on the first embodiment, this embodiment can greatly contribute to further reducing the sizes (or areas), lightening the weights and diminishing the thicknesses of portable electronic equipment which include an IC card, a portable telephone, a PDA, a notebook type personal computer, etc.

FIG. 2, FIGS. 3A and 3B, FIGS. 5A thru 5D, FIGS. 6E thru 6G, FIG. 8, and FIG. 9 are views showing a method of manufacturing a semiconductor device according to the second embodiment of the present invention. Incidentally, those parts of the manufacturing process in the second embodiment which are the same as in the first embodiment shall be omitted from description.

Likewise to the first embodiment, the second embodiment is such that the present invention is applied to a process for mounting semiconductor device components. Concretely, it is an example in which, after the back surface of a silicon wafer has been subjected to a thinning work by grinding and spin etching, metal VIA wiring lines penetrating through the silicon wafer are formed in electrode pads arranged at the peripheral edge of an LSI, a plurality of thinned semiconductor chips are joined to each other or one another by employing ACFs (anisotropic conductive films) as joint means, and the resulting thinned semiconductor chips are mounted on a mother board by stacked (or multilayer) three-dimensional (or multilevel) mounting.

As shown in FIG. 2, while a wafer 22 is being rotated, the back surface thereof is subjected to a grinding work under conditions stated below, by a grinding wheel 18 kept rotating. Thus, as shown in FIG. 3B, the wafer 22 is ground and thinned down to a thickness of 150 [μm], and the back surface flaws 16 thereof are removed by the grinding.

Feed speed of Grinding wheel: 150 [μm/min]
Rotational frequency of Grinding wheel: 2500 [r.p.m.]
Thickness of Ground wafer: 150 [μm] (Thickness diminished by Grinding: About 475 [μm])

Figure 9:
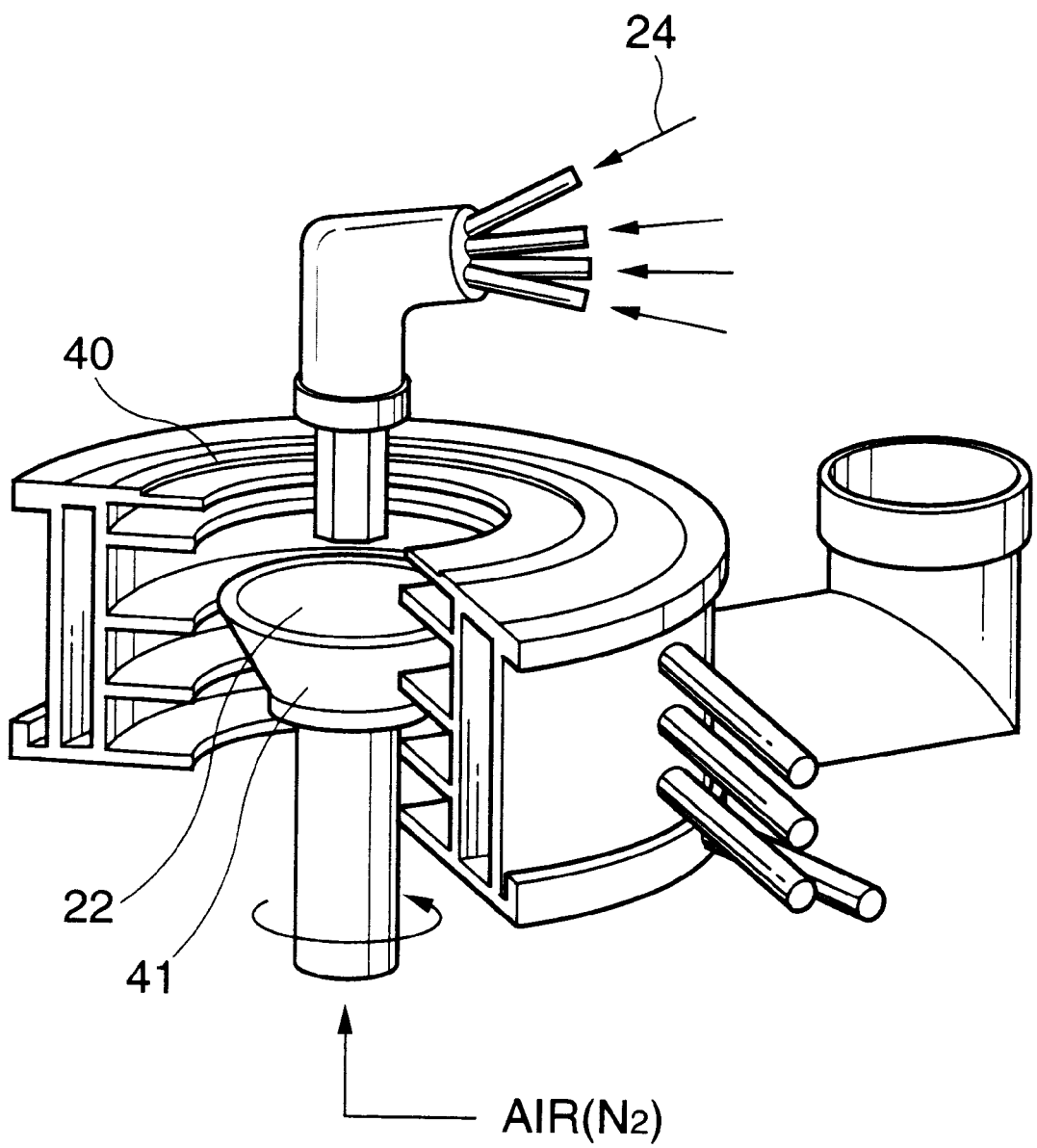
FIG. 9 is a perspective sectional view schematically showing a spin etching apparatus which is employed for the finishing work of a ground and thinned wafer in the method of manufacturing the semiconductor device according to the second embodiment of the present invention.

Thereafter, the wafer 22 subjected to the thinning work is set on a wafer chuck 41 located within the process chamber 40 of a spin etching apparatus shown in FIG. 9. While the wafer 22 is being rotated, the back surface of the wafer 22 is supplied with, for example, a mixed solution (etchant) 24 consisting of hydrofluoric acid and nitric acid, and it is etched under conditions stated below, thereby to perform the finishing treatment of the back surface of the wafer 22. Thus, damages having been formed on the back surface of the wafer 22 due to the grinding are removed, and the mechanical strength of the wafer 22 etched and thinned down to a thickness of 100 [μm] can be enhanced.

Rotational frequency of Wafer: 2000 [r.p.m.]
Composition of Etchant: $HF/HNO_3/H_2O=1/1/8$
Supply rate of Etchant: 40 [l./min]
Thickness of Wafer diminished by Etching: 50 [μm]
Subsequently, processing steps shown in FIGS. 5A–5D and FIGS. 6E–6G are carried out in the same way as in the first embodiment, thereby to fabricate a thinned device wafer for the stacked three-dimensional mounting as has penetrant VIA wiring plugs 23. Thereafter, Au wire bumps 12 (in FIG. 8), for example, are formed as connection means on the electrode pads of the metal wiring plugs 23.

Figure 8:
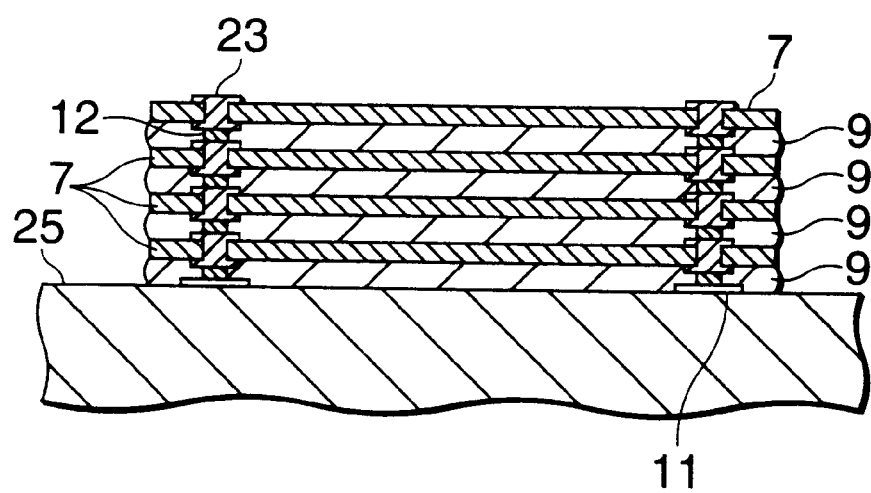
FIG. 8 illustrates the semiconductor device according to the second embodiment of the present invention, and it is a sectional view showing a state where thinned semiconductor device chips are mounted on a mother board by stacked three-dimensional mounting.

The thinned device wafer which has been formed with the penetrant VIA wiring plugs 23 in the above way, is divided into individual chips by dicing, whereby the thinned semiconductor device chips 7 (four layers) for the stacked three-dimensional mounting as shown in FIG. 8 are completed.

Thereafter, as shown in FIG. 8, a printed-wiring circuit board (mother board) 25 having Cu lands 11 is prepared, and the semiconductor device chips 7 are registered over the mother board 25. Subsequently, the chip 7 of the first layer is mounted on the mother board 25. By way of example, ACFs (anisotropic conductive films) 9 are employed as the joint means between the Au wire bumps 12 of the chips 7 and also between the bumps 12 of the first-layer chip 7 and the Cu lands 11 of the mother board 25 on this occasion. First, the respective bumps 12 of the first-layer chip 7 are electrically connected with the corresponding Cu lands 11 of the mother board 25 by the ACF 9.

Thereafter, the chip 7 of the second layer is mounted on the first-layer chip 7 through the ACF 9, the chip 7 of the third layer is mounted on the second-layer chip 7 through the ACF 9, and the chip 7 of the fourth layer is mounted on the third-layer chip 7 through the ACF 9. Thus, the metal wiring plugs 23 of the first-layer chip 7 thru the fourth-layer chip 7 are electrically connected to each other or one another by the Au wire bumps 12 and the ACFs 9. In this way, the semiconductor device of very low mounting height is mounted on the mother board 25 by the stacked three-dimensional mounting.

The second embodiment can also attain the same effects as those of the first embodiment.

Incidentally, the present invention is not restricted to the foregoing embodiments, but it can be performed in various modifications. By way of example, the structure and constituent materials of a semiconductor device, a processing apparatus, processing conditions, etc. can be properly chosen within a scope not departing from the purport of the present invention.

Besides, in the first embodiment, both the surfaces of the silicon substrate 1 are coated with the epoxy type liquefied resins 8, 28, but they can be coated with an organic resist material or the like.

In addition, the first and second embodiments have been described premising that the manufacturing steps till the formation of the penetrant VIA metal wiring lines are all carried out in the wafer state, but the wafer can be diced into the chips at any intermediate manufacturing step beforehand as may be needed.

Further, in the second embodiment, the wet etching with the etchant (mixed solution) has been exemplified as the etching for the finishing treatment of the thinned wafer, but dry etching with a halogen type gas can be performed by employing a plasma etching apparatus.

As described above, according to the present invention, a semiconductor device wafer is worked from its back surface, thereby to diminish the thickness of the semiconductor device wafer down to at most 200 [µm], penetrant apertures are formed in the thinned semiconductor device wafer, and wiring plugs are formed in the penetrant apertures. It is accordingly possible to provide a semiconductor device and a manufacturing method therefor which can incarnate the ultrathin stacked (or multilayer) three-dimensional (or multilevel) mounting of semiconductor device components at a high reliability and with a high functionality.

What is claimed is:

1. A method of manufacturing a semiconductor device, comprising:

presenting a semiconductor device wafer comprising a large-scale integrated circuit and an electrode pad lying at a peripheral edge of the large-scale integrated circuit on a circuit side, the semiconductor device wafer further comprising a back surface that includes a plurality of flaws that are a result of at least a process by which the large-scale integrated circuit is formed;

working the semiconductor device wafer from the back surface to diminish a first thickness of the semiconductor device wafer to at least until the plurality of flaws are removed so as to form a thinned wafer;

coating both a front surface and the back surface of the thinned wafer with a first insulating material to form a first coated wafer;

forming a hole through each coating of insulating material, the electrode pad, and the thinned wafer; and forming in the hole a wiring plug to join the front and back surfaces of the first coated wafer.

2. A method of manufacturing a semiconductor device as defined in claim 1, wherein the first thickness of the semiconductor device wafer is reduced to a second thickness that substantially is not less than 100 µm and, after forming the hole, the method further comprising:

coating the front and back surfaces of the first coated wafer with a second insulating material to fill up the hole with the second insulating material and to form a second coated wafer; and forming a penetrant aperture in the second insulating material contained in the hole, wherein the penetrant aperture defines a diameter that is smaller than a diameter of the hole.

3. A method of manufacturing a semiconductor device, comprising in the following order:

presenting a semiconductor device wafer comprising a large-scale integrated circuit and an electrode pad lying at a peripheral edge of the large-scale integrated circuit;

working the semiconductor device wafer from a back surface to diminish a first thickness of the semiconductor device wafer to a second thickness that substantially is not less than 100 µm, wherein the resulting wafer defines a thinned wafer;

coating both a front surface and the back surface of the thinned wafer with a first insulating material to form a first coated wafer;

forming a hole through each coating of insulating material, the electrode pad, and the semiconductor device wafer;

coating the front and back surfaces of the first coated wafer with a second insulating material to form a second coated wafer and to fill up the hole with the second insulating material;

forming in the second insulating material contained in the hole a penetrant aperture having a diameter that is smaller than a diameter of the hole so as to leave insulating material from the second insulating material on an inwall of the hole;

forming wiring layers which join an interior of the penetrant aperture and the front and back surfaces of the semiconductor device wafer; and patterning the wiring layers to form a wiring plug that includes respective electrode pads on a front and back surface of the second coated wafer to join the front and back surfaces of the second coated wafer.

4. A method of manufacturing a semiconductor device as defined in claim 3, wherein the wiring plug is formed by subjecting the second coated wafer first to electroless plating and then to electroplating in succession.

5. A method of manufacturing a semiconductor device as defined in claim 4, wherein the first and second insulating materials are made of a member selected from the group consisting of a liquefied resin and an organic resist material, and wherein the first thickness of the semiconductor device wafer is reduced to a second thickness that substantially is not less than 200 µm.

6. A method of manufacturing a semiconductor device, comprising in the following order:

presenting a semiconductor device wafer comprising a large-scale integrated circuit;

working the semiconductor device wafer from a back surface to diminish a first thickness of the semiconductor device wafer to a second thickness that substantially is not less than 100 µm, wherein the resulting wafer defines a thinned wafer;

forming penetrant apertures in the thinned wafer;

forming wiring plugs in the respective penetrant apertures of the thinned wafer;

dicing the thinned wafer into semiconductor chips, wherein each semiconductor chip includes wiring plugs; and stacking and mounting at least two of the semiconductor chips over a printed-wiring circuit board through means for connecting connected with the wiring plugs.

7. A method of manufacturing a semiconductor device as defined in claim 6, wherein working the semiconductor device wafer includes one of grinding, chemical mechanical polishing, and etching.

8. A method of manufacturing a semiconductor device as defined in claim 6, wherein the means for connecting includes at least one member selected from the group consisting of a solder ball bump, a wire bump, an anisotropic conductive film, and a conductive paste, and wherein the first thickness of the semiconductor device wafer is reduced to a second thickness that substantially is not less than 200 µm.

9. A method to manufacture a semiconductor device, comprising in the following order:

presenting a wafer defining a first thickness, wherein the wafer comprises a large-scale integrated (LSI) circuit surface having at least one electrode pad, the wafer further comprising a second surface, wherein the second surface includes a plurality of flaws that are a result of at least a process by which the large-scale integrated circuit surface is formed;

grinding the second surface of the wafer at least until the plurality of flaws are removed to create a third surface;

polishing the third surface of the wafer;

forming a penetrant hole between the LSI circuit surface and the third surface and through the at least one electrode pad while restraining a tapering angle of the penetrant hole from widening at an open end;

curing penetrant hole resin in the penetrant hole and over the at least one electrode pad;

forming a via hole through the penetrant hole resin so as to leave a uniform layer of penetrant hole resin between the via hole and the penetrant hole; and packing a metal plug into the via hole without developing voids.

10. The method of claim 9, wherein grinding the second surface of the wafer results in a wafer that defines a second thickness, wherein the second thickness substantially is not more than 30% of the first thickness.

11. The method of claim 10, wherein the second thickness substantially is not more than 20% of the first thickness.

12. The method of claim 9, wherein polishing the second surface of the wafer results in a wafer that defines a polished thickness that substantially is not less than 100 μm.

13. The method of claim 12, wherein polishing the second surface of the wafer is by one of chemical mechanical polishing, wet acid etch polishing, and dry gas polishing.

14. The method of claim 9, wherein restraining a tapering angle of the penetrant hole from widening at an open end includes curing resin on the LSI circuit surface and the third surface and forming the penetrant hole between the resin on the LSI circuit surface and the third surface.

15. The method of claim 9, wherein the metal plug defines a funnel shape a first end and a second end.

16. The method of claim 9, wherein packing the metal plug into the via hole includes employing electroless plating and then employing electroplating.

* * * * *